United States Patent [19]

Miyashita et al.

[11] Patent Number: 5,738,959
[45] Date of Patent: Apr. 14, 1998

[54] HALFTONE PHASE SHIFT PHOTOMASK, HALFTONE PHASE SHIFT PHOTOMASK BLANK, AND METHOD OF PRODUCING THE SAME COMPRISING FLUORINE IN PHASE SHIFT LAYER

[75] Inventors: Hiroyuki Miyashita; Hiroshi Mohri; Masahiro Takahashi; Naoya Hayashi, all of Tokyo, Japan

[73] Assignees: Dai Nippon Printing Co., Ltd.; Mitsubishi Electric Corporation, both of Tokyo, Japan

[21] Appl. No.: 722,439

[22] Filed: Oct. 17, 1996

Related U.S. Application Data

[63] Continuation of Ser. No. 292,263, Aug. 17, 1994, abandoned.

[30] Foreign Application Priority Data

Aug. 17, 1993 [JP] Japan .................. 5-203234
Apr. 27, 1994 [JP] Japan .................. 6-089488
May 19, 1994 [JP] Japan .................. 6-105209

[51] Int. Cl.$^6$ ............................................ G03F 9/00
[52] U.S. Cl. ............................................ 430/5
[58] Field of Search .................. 430/5, 322; 428/203, 428/472, 696, 698; 427/582

[56] References Cited

U.S. PATENT DOCUMENTS 5,380,608  1/1995  Miyoshita et al. ............ 430/5
5,419,988  5/1995  Mohri et al. ................. 430/872

FOREIGN PATENT DOCUMENTS 63-081426  4/1988  Japan .

OTHER PUBLICATIONS

Patent Abstracts of Japan, vol. 014, No. 565 (P-1143), Dec. 1990 for JP-A-02 242252 (Toppan Printing Co., Ltd.), 26 Sep. 1990.
Patent Abstracts of Japan, vol. 016, No. 407 (P-1411), Aug. 1992 for JP-A-04 136854 (Hitachi Ltd), 11 May 1992.

*Primary Examiner*—S. Rosasco
*Attorney, Agent, or Firm*—Sughrue, Mion, Zinn, Macpeak & Seas, PLLC

[57] ABSTRACT

A halftone phase shift photomask having a sufficiently high transmittance for light of short wavelength and usable for high-resolution lithography effected by exposure using deep-ultraviolet+radiation, e.g., krypton fluoride excimer laser light. The halftone phase shift photomask has on a transparent substrate a halftone phase shift layer which includes at least one layer composed mainly of a chromium compound. The chromium compound contains at least fluorine atoms in addition to chromium atoms. A transmittance higher than a predetermined level can be obtained even in exposure carried out at a relatively short wavelength. The photomask can be used for exposure using deep-ultraviolet+radiation, e.g., krypton fluoride excimer laser light (wavelength: 248 nm). Thus, high-resolution lithography can be realized. Since the photomask can be formed by approximately the same method as in the case of the conventional photomasks, it is possible to improve the yield and reduce the cost.

19 Claims, 11 Drawing Sheets

FIG. 16
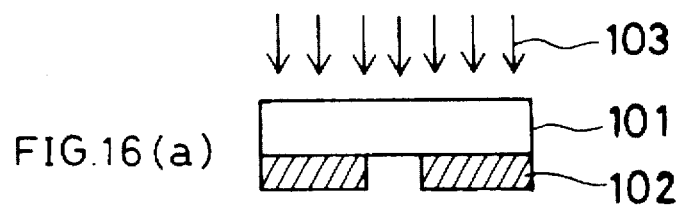
FIG.16(a)
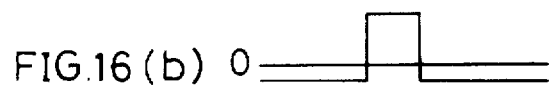
FIG.16(b)
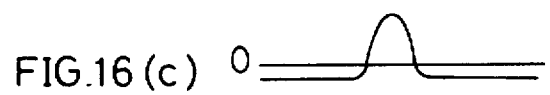
FIG.16(c)
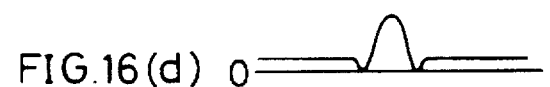
FIG.16(d)
FIG. 17
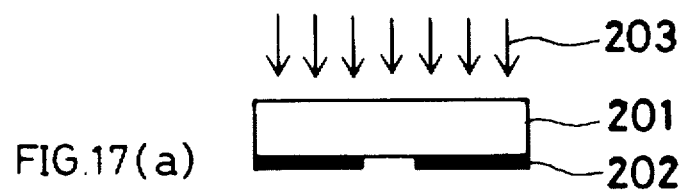
FIG.17(a)
FIG.17(b)
FIG.17(c)
FIG.17(d)

HALFTONE PHASE SHIFT PHOTOMASK, HALFTONE PHASE SHIFT PHOTOMASK BLANK, AND METHOD OF PRODUCING THE SAME COMPRISING FLUORINE IN PHASE SHIFT LAYER

This is a continuation of application Ser. No. 08/292,263 filed Aug. 17, 1994 now abandoned.

BACKGROUND OF THE INVENTION

The present invention relates to a photomask used for producing integrated circuits of high integration density, e.g., large-scale integrated circuits (LSI), very large-scale integrated circuits (VLSI), etc., and to a photomask blank used to produce the photomask. The present invention also relates to a method of producing the photomask blank. More particularly, the present invention relates to a halftone phase shift photomask whereby a projected image of very small size can be obtained, and also to a halftone phase shift photomask blank for producing the halftone phase shift photomask. Further, the present invention relates to a method of producing the halftone phase shift photomask blank.

Semiconductor integrated circuits, e.g., IC, LSI, VLSI, etc., are produced by repeating lithography processes using photomasks. To form semiconductor integrated circuits of very small size in particular, use of a phase shift photomask has heretofore been considered, as disclosed, for example, in Japanese Patent Application Laid-Open (KOKAI) No. 58-173744 (1983) and Japanese Patent Application Post-Exam Publication No. 62-59296 (1987), and phase shift photomasks having various arrangements have been proposed. Among them, what is called halftone phase shift photomask such as is disclosed in Japanese Patent Application Laid-Open (KOKAI) No. 4-136854 (1992), U.S. Pat. No. 4,890,309, etc. has attracted attention from the expectation that it will soon be put to practical use, and some proposals have been made with regard to arrangements and materials of the halftone phase shift photomask, which enable an improvement in yield and a reduction in cost as a result of a reduction in the number of manufacturing steps required. For example, see Japanese Patent Application Laid-Open (KOKAI) Nos. 5-2259 (1993) and 5-127361 (1993).

The halftone phase shift photomask will briefly be explained below with reference to the accompanying drawings. FIGS. 16(a) to 16(d) show the principle of the halftone phase shift lithography, and FIGS. 17(a) to 17(d) show a conventional lithography method. FIGS. 16(a) and 17(a) are sectional views showing photomasks. FIGS. 16(b) and 17(b) each show the amplitude of light on the photomask. FIGS. 16(c) and 17(c) each show the amplitude of light on a wafer. FIGS. 16(d) and 17(d) each show the light intensity on the wafer. Reference numerals 101 and 201 denote substrates, and 202 a 100% light-blocking film. A semitransparent film 102 shifts the phase of incident light through substantially 180° and has a transmittance of 1% to 50%. Reference numerals 103 and 203 denote incident light. In the conventional method, as shown in FIG. 17(a), the 100% light-blocking film 202, which is made of chromium, for example, is formed on the substrate 201, which is made of quartz (fused silica), for example, and the light-blocking film 202 is merely formed with a light-transmitting portion in a desired pattern. Accordingly, the light intensity distribution on the wafer has a gentle slope, as shown in FIG. 17(d). As a result, the resolution is degraded. In the halftone phase shift lithography, on the other hand, the light passing through the semitransparent film 102 and the light passing through the opening in the film 102 are in substantially inverse relation to each other in terms of phase. Accordingly, the light intensity at the pattern boundary portion on the wafer is 0, as shown in FIG. 16(d). Thus, it is possible to prevent the light intensity distribution from exhibiting a gentle slope. Accordingly, the resolution can be improved.

It should be noted here that a phase shift lithography process of a type other than the halftone phase shift lithography requires at least two photoengraving processes to produce a mask pattern because the light-blocking film and the phase shifter film have different patterns, whereas the halftone phase shift lithography essentially requires only one photoengraving process because it involves only one pattern; this is a great advantage of the halftone phase shift lithography.

Incidentally, the semitransparent film 102 of the halftone phase shift photomask is demanded to perform two functions, that is, phase inversion and transmittance control. Regarding the phase inversion function, the semitransparent film 102 should be arranged such that exposure light passing through the halftone phase shift portion and exposure light passing through the opening in the film 102 are in substantially inverse relation to each other in terms of phase. If the semitransparent film 102 is treated as an absorbing film which is shown in M. Born, E. Wolf "Principles of Optics", pp. 628–632, for example, multiple interference can be neglected. Accordingly, the phase change ϕ of perpendicularly transmitted light may be calculated as follows:

$$\phi = \sum_{k=1}^{m-1} x^{k,k+1} + \sum_{k=2}^{m-1} 2\pi(u_k - 1)d_k/\lambda \quad (1)$$

where ϕ is the phase change of light perpendicularly passing through a photomask having a multilayer (m−2 layers) film formed on a substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and λ is the wavelength of exposure light. It is assumed here that the layer of k=1 is the substrate, and the layer of k=m is air.

The above-described phase shift effect is obtained when ϕ falls within the range of nπ±π/3 radians (n is an odd integer).

Meanwhile, the transmittance for exposure light of the halftone phase shift portion that is most suitable for obtaining the halftone phase shift effect is determined by the size, area, layout, configuration, etc., of the transfer pattern. That is, the optimal transmittance varies with each particular transfer pattern. Practically, it is necessary in order to obtain the halftone phase shift effect to set the exposure light transmittance of the halftone phase shift portion within the range of optimal transmittance (determined by each transfer pattern)±several %. In general, the optimal transmittance varies in a wide range, i.e., from 1% to 50%, according to transfer patterns, when the transmittance at the opening of the halftone phase shift layer is assumed to be 100%. That is, halftone phase shift masks having various levels of transmittance are demanded in order to deal with various patterns.

In actuality, the phase inversion function and transmittance control function are determined by the complex index of refraction (refractive index and extinction coefficient) of a substrate material and a material constituting a halftone phase shift film (a material constituting each layer, in the case of a multilayer film) and the film thickness. That is, a material usable as a halftone phase shift layer of a halftone phase shift photomask is required to have a transmittance for exposure light in the range of from 1% to 50% when the halftone phase shift film is formed on a substrate with the film thickness controlled so that the phase difference $\phi$ obtained by the above equation (1) falls within the range of $n\pi \pm \pi/3$ radians (n is an odd integer). As such material, films which are composed mainly of a chromium compound are known, as disclosed, for example, in Japanese Patent Application Laid-Open (KOKAI) No. 5-127361 (1993).

Incidentally, the films composed mainly of a chromium compound are chromium oxide, chromium nitride, chromium oxide nitride, chromium oxide carbide, and chromium oxide carbide nitride, and the transmittances for exposure light of these films largely depend on the wavelength of exposure light. For example, FIG. 18 shows a spectral transmittance curve of a chromium oxide film formed on a synthetic quartz substrate by reactive sputtering in an oxygen atmosphere using a chromium target. In this case, the thickness of the chromium oxide film is about 50 nm. As will be clear from FIG. 18, the transmittance of the chromium oxide film rapidly falls off in the short wavelength region. Therefore, a halftone phase shift photomask that uses the chromium oxide film as a halftone phase shifter layer can be used for exposure at the g-line (436 nm) and i-line (365 nm) of a super-high pressure mercury lamp, but cannot be used for exposure using krypton fluoride excimer laser light (248 nm), whereby higher resolution can be realized, because the transmittance is excessively low. Similarly, the chromium nitride, chromium oxide nitride, chromium oxide carbide and chromium oxide carbide nitride films cannot be used for exposure using krypton fluoride excimer laser light and are therefore impossible to use for high-resolution lithography.

SUMMARY OF THE INVENTION

Under these circumstances, the object of the present invention is to provide a halftone phase shift photomask having a sufficiently high transmittance for light of short wavelength and usable for high-resolution lithography effected by exposure using deep-ultraviolet radiation, e.g., krypton fluoride excimer laser light, and also provide a blank used to produce the halftone phase shift photomask.

In view of the above-described problems, the present inventors conducted exhaustive studies in order to develop a halftone phase shift material having a transmittance falling within a range in which it is usable as a halftone phase shift layer when formed into a film having a thickness at which the phase of deep-ultraviolet light, e.g., krypton fluoride excimer laser light, is inverted. As a result, we accomplished the present invention.

That is, the present invention relates to a halftone phase shift photomask having a halftone phase shift layer which includes at least one layer composed mainly of a chromium compound containing at least fluorine atoms, and a blank used to produce the halftone phase shift photomask, and also relates to a method of producing the halftone phase shift photomask blank. A film which is composed mainly of a chromium compound containing fluorine atoms is superior in the transmittance in the short wavelength region to the conventional film composed mainly of chromium oxide, chromium nitride, chromium oxide nitride, chromium oxide carbide, or chromium oxide carbide nitride, which contains no fluorine atoms. Therefore, even if a film that is composed mainly of a chromium compound containing fluorine atoms is formed on a transparent substrate to a thickness at which the phase of deep-ultraviolet light, e.g., krypton fluoride excimer laser light, is inverted, it is possible to obtain a transmittance sufficiently high for the film to be used as a halftone phase shifter film.

In the halftone phase shift lithography, the refractive index and extinction coefficient for exposure light of a film that constitutes a halftone phase shift layer are obtained, for example, by ellipsometry, and the film is adjusted so that the transmittance of the film when formed on a transparent substrate to a thickness adequate to invert the phase of exposure light, which is obtained from the above equation (1), is equal to the optimal transmittance determined by the relevant transfer pattern and so forth. Assuming that exposure is carried out using krypton fluoride excimer laser light, the conventional film composed mainly of chromium oxide, chromium nitride, chromium oxide nitride, chromium oxide carbide, or chromium oxide carbide nitride, which contains no fluorine atoms, cannot be used as a halftone phase shift layer because the transmittance at the film thickness adequate for phase inversion is excessively low. In contrast, the chromium compound containing fluorine atoms according to the present invention varies in refractive index and extinction coefficient according to the proportions of fluorine atoms and other atoms contained. Therefore, the composition of the chromium compound can be adjusted so that the transmittance for exposure light at a film thickness adequate for phase inversion is equal to the optimal transmittance required. In this case, the chromium compound film may be used as a halftone phase shift layer in the form of a single layer. However, the arrangement may be such that a chromium compound film is first formed so that the transmittance for exposure light is higher than is required, and then a light-blocking layer is stacked thereon to adjust the transmittance within the range in which the phase inversion function is not impaired.

Further, the halftone phase shift photomask and halftone phase shift photomask blank of the present invention, in which a chromium compound containing fluorine atoms is used as a halftone phase shift layer, have an advantage in that the transmittance for exposure light can be changed by heating them to 150° C. or higher in the air or a vacuum after the production thereof. The transmittance for exposure light can also be changed by exposing them to an oxidizing atmosphere, e.g., air, water vapor, etc., or a reducing atmosphere, e.g., hydrogen. In these cases, the transmittance for exposure light can be changed even more effectively by exposing the photomask or the blank to the plasma of a gas such as is described above.

The chromium compound containing fluorine atoms according to the present invention can be formed by using a conventional thin-film forming technique, e.g., sputtering, vacuum deposition, ion plating, etc.

To obtain a chromium compound film containing fluorine atoms according to the present invention by sputtering, a target composed mainly of metal chromium with or without a fluorinated surface is used, and film formation by sputtering is effected by inducing DC or RF electric discharge in an atmosphere which contains only a sputter gas, e.g., argon, neon, xenon, helium, nitrogen, etc., or a combination of such a sputter gas and a fluorine source gas, e.g., fluorine, carbon tetrafluoride, sulfur hexafluoride, nitrogen trifluoride, chlorine trifluoride, etc. If necessary, the atmosphere may be mixed with an oxygen, nitrogen or carbon source gas, e.g., oxygen, nitrogen or carbon dioxide gas. In this case, the refractive index and extinction coefficient of the resulting film can be controlled by changing film forming conditions such as the composition of the atmosphere gas, pressure, sputter power, etc. to thereby change the composition, texture, structure, etc. of the film.

To form a chromium compound film containing fluorine atoms according to the present invention by vacuum evaporation, metal chromium or prefluorinated chromium is used as an evaporation source, and vacuum evaporation is carried out by either the resistance heating method using a tungsten basket, a tungsten-plated coil or boat, a carbon crucible, etc., or the EB (Electron Beam) evaporation method by irradiation with electron rays. The vacuum evaporation is an atmosphere which contains a fluorine source gas, i.e., fluorine, carbon tetrafluoride or other carbon fluoride compound, sulfur hexafluoride or other sulfur fluoride compound, nitrogen trifluoride, chlorine trifluoride, etc. If necessary, the fluorine source gas may be mixed with an oxygen, nitrogen or carbon source gas, e.g., oxygen, nitrogen or carbon dioxide gas. In this case also, the refractive index and extinction coefficient of the resulting film can be controlled by changing the evaporation conditions to thereby change the composition, texture, structure, etc. of the film.

To form a chromium compound film containing fluorine atoms according to the present invention by ion plating, metal chromium or prefluorinated chromium is used an evaporation source, and a fluorine source gas, e.g., fluorine, carbon tetrafluoride, sulfur hexafluoride, nitrogen trifluoride, chlorine trifluoride, etc. is used to form an atmosphere. If necessary, the fluorine source gas may be mixed with an oxygen, nitrogen or carbon source gas, e.g., oxygen, nitrogen or carbon dioxide gas. In this case also, the refractive index and extinction coefficient of the resulting film can be controlled by changing the film forming conditions.

In the chromium compound film containing fluorine atoms according to the present invention, the optical constant of the film is determined by the content of fluorine and other component, as described above. Therefore, it is important to precisely control the composition of the film in order to obtain a halftone phase shift photomask of high accuracy. It is rare for a stoichiometrically stable compound to fulfill both the phase inversion function and the transmittance control function. Therefore, it is generally demanded to form a film of an intermediate compound. Accordingly, the present invention also provides a novel method of forming a film of such an intermediate compound with a desired composition and at high accuracy.

That is, the method of producing a chromium compound containing fluorine atoms according to the present invention is a thin-film forming method in which chromium is evaporated in a vacuum chamber and deposited on a transparent substrate for a photomask. According to the method of the present invention, the evaporated chromium is allowed to react with fluorine atoms before being deposited on the substrate. Particularly, the reaction of chromium with fluorine atoms is carried out by allowing the evaporated chromium to pass through the plasma of a gas containing fluorine atoms. The chromium evaporation source may be either pure metal chromium or a chromium compound. Preferable methods for evaporating the chromium are bombardment with accelerated electrons by an electron gun and bombardment with ions by an ion gun. It is also possible to employ resistance heating using a coil or a boat. The above-described plasma may be generated by applying a capacitance- or inductively-coupled RF electric field to a space where a gas containing fluorine atoms has previously been introduced. The plasma may also be generated by using a DC electric field. It is also possible to employ a method wherein a gas ionized by an ion gun is supplied to the space where a gas containing fluorine atoms has previously been introduced, or a method wherein a gas containing fluorine atoms is ionized by an ion gun before being introduced into the space. As the gas containing fluorine atoms, it is possible to use fluorine, a carbon fluoride gas, sulfur hexafluoride, nitrogen trifluoride, chlorine trifluoride, etc.

Further, it is possible to form a fluorine atom-containing chromium compound film having a uniform thickness and a desired composition by generating chromium particles from a chromium target by sputtering and further generating a plasma from a fluorine atom-containing gas by an ion gun.

The optical constant of the compound film formed by the film forming method can be controlled by controlling the reaction taking place in the above-described plasma space, i.e., the quantity of chromium to be evaporated, the flow rate of the fluorine atom-containing gas, pressure, and the electric power applied for generation of plasma. Since the configuration of the reaction space, the gas introducing method and other characteristics of a system used for the film formation also have effects on the optical characteristics of the film formed, it is preferable to properly set reaction conditions by taking into consideration the characteristics of the system. It is also possible to heat the substrate on which the chromium compound containing fluorine atoms is to be deposited.

The above-described method of producing a chromium compound containing fluorine atoms enables a desired composition to be accurately realized even in an intermediate state which is not stoichiometrically stable, and hence makes it possible to form halftone phase shift films having various optical constants. The method also has an advantage in that it is possible to readily obtain a film reduced in the residual stress and improved in the adhesion to the substrate. In addition, the deposition rate is also satisfactory for practical use.

Although in the foregoing description the present invention has been explained with regard to a single-layer film of a chromium fluoride compound, it should be noted that the present invention is similarly applicable to a halftone phase shift photomask and a halftone phase shift photomask blank, in which the halftone phase shift layer has a multilayer structure.

Further, in a case where a chromium compound film containing fluorine atoms formed by the method of the present invention is used as a halftone phase shift layer in the form of a single layer, it can be patterned by approximately the same method as that used for the chromium light-blocking film of the conventional photomask because the chromium compound film in the present invention has chromium atoms as the matrix. Even in the case of a multilayer film, when the chromium compound containing fluorine atoms is used in combination with chromium, chromium oxide, chromium nitride, chromium oxide nitride, chromium oxide carbide, chromium oxide carbide nitride, etc., photoengraving can be accomplished in a single patterning process by approximately the same method as in the case of the conventional technique. Accordingly, it is possible to improve the yield and reduce the cost.

Formation of a chromium compound film containing fluorine atoms according to the present invention will be explained below in detail by way of an example in which reactive direct current (DC) sputtering is carried out in a mixed gas atmosphere containing argon gas and carbon tetrafluoride gas serving as a fluorine source by using metal chromium as a target.

Films are formed on a satisfactorily cleaned silicon wafer with the argon gas/carbon tetrafluoride gas flow rate ratio varied. Then, the refractive index and extinction coefficient of each film are measured with a commercially available spectroellipsometer. Further, a film thickness required for shifting the phase of exposure light through 180° is calculated with regard to exposure process using, for example, krypton fluoride excimer laser light (wavelength: 248 nm), and a synthetic quartz substrate. If the transmittance for exposure light of the film when actually formed to the calculated thickness on the synthetic quartz substrate for a photomask falls within the range of from 1% to 50%, the film can be used as a halftone phase shift film.

FIG. 8 shows the results of measurement of the refractive index and extinction coefficient at the wavelength 250 nm for various argon gas/carbon tetrafluoride gas flow rate ratios: 100:0, 90:10, 80:20, 78:22, 76:24, 74:26, 72:28, and 65:35. In this example, an ordinary planar DC magnetron sputtering system was used, and the film formation was carried out under the conditions that the gas pressure was 4.0 mTorr; the overall gas flow rate of the argon gas and the carbon tetrafluoride gas was 100 sccm; and the sputter current density was 0.01 A/cm$^2$. As the spectroellipsometer, ES-4G (manufactured by Sopra) was employed, and software MOSS (manufactured by Sopra) was used to calculate the optical constant. FIG. 9 shows the film thickness required to shift the phase of exposure light of 250 nm through 180°, which is obtained from the above equation (1), for various gas flow rate ratios. It will be understood from the figure that although the required film thickness varies with the gas flow rate ratio, the phase of exposure light of wavelength 250 nm is inverted at the film thickness range of from 120 nm to 220 nm.

FIG. 10 shows the transmittance for light (250 nm) of a film formed to about 170 nm on a synthetic quartz substrate for a photomask of 90 mil in thickness for each gas flow rate ratio. In the transmittance measurement, a spectrophotometer (HP8450A, manufactured by Hewlett-Packard Co.) was employed, and the air was used as a reference. It will be understood from FIGS. 9 and 10 that under the above-described film forming conditions, a fluorine atom-containing chromium compound film usable as a halftone phase shift layer is obtained when the argon gas/carbon tetrafluoride gas flow rate ratio is in a region where the proportion of the carbon tetrafluoride gas flow rate is higher than at least 10%.

FIGS. 11(a) to 11(c) show the composition ratios of chromium, fluorine, carbon and oxygen in the film for each flow rate ratio, measured by X-ray photoelectron spectroscopy (XPS). In this case, the film was analyzed into chromium, fluorine, carbon, and oxygen. FIGS. 11(a), 11(b) and 11(c) respectively show the numbers of fluorine, carbon and oxygen atoms existing per 100 chromium atoms. The X-ray photoelectron spectroscopy was carried out under the conditions described later. As will be clear from FIGS. 9, 10 and 11(a), as the fluorine atom content in the film increases, the transmittance for exposure light at which phase inversion takes place becomes higher. In general, an exposure light transmittance in the range of from 1% to 50% is required to obtain the halftone phase shift effect. Accordingly, for the chromium compound of the present invention to become a proper halftone phase shift material, it is particularly necessary for the fluorine atom content in the film to be at least 100 fluorine atoms per 100 chromium atoms. If the number of fluorine atoms is smaller than 100 per 100 chromium atoms, the resulting film is a light-blocking film close to a metal film, as will be clear from FIGS. 10 and 11(a). Consequently, when formed to a thickness required to invert the phase of exposure light, the film transmits substantially no exposure light, resulting in a failure to obtain the halftone phase shift effect. On the other hand, a film containing 350 or more fluorine atoms per 100 chromium atoms cannot provide the halftone phase shift effect in this state, but it can be used as a halftone phase shift film if it is combined with a film having high light-blocking properties within the range in which the amount of phase shift is not substantially changed.

As shown in FIGS. 11(b) and 11(c), there is no clear correlation between carbon and oxygen atoms and the halftone phase shift function as is observed in the case of fluorine atoms. The chromium compound film formed under the above-described conditions contains not more than 250 carbon atoms and not more than 150 oxygen atoms per 100 chromium atoms, as shown in FIGS. 11(b) and 11(c). However, no clear relation can be found between the carbon and oxygen atom contents and the characteristics required for the halftone phase shift film as is recognized with the fluorine atom content. It is considered that the carbon atoms are supplied from the carbon tetrafluoride gas during the sputtering process. The carbon atoms may also be considered to be contaminant migrating from the film forming atmosphere or the analytical atmosphere. Particularly, in the case of a vacuum, there is a strong possibility of contamination being caused by a vacuum pump or the like. In the case of the above-described conditions, oxygen atoms are not positively supplied during the sputtering process. Therefore, the oxygen atoms are considered to be supplied by leakage in the film forming system or oxidation during the analysis made after the film forming process. In any case, a film, in which the numbers of carbon and oxygen atoms are not larger than 250 and not larger than 150, respectively, per 100 chromium atoms, can be satisfactorily used as a halftone phase shift film, as will be clear from FIGS. 8 to 11(c).

Under the above-described film forming conditions, a fluorine atom-containing chromium compound film usable as a halftone phase shift layer is obtained when the argon gas/carbon tetrafluoride gas flow rate ratio is in a region where the proportion of the carbon tetrafluoride gas flow rate is higher than at least 10%, as has been described above. In general, the above flow rate ratio region differs according to film forming conditions and systems. However, with regard to the composition ratio between chromium and fluorine atoms in particular, only when the number of fluorine atoms is at least 100 per 100 chromium atoms, it is possible to obtain a compound film that provides the halftone phase shift effect regardless of the film forming conditions and film forming system used. Similarly, even in the case of film formation by sputtering that uses a gas other than an argon/carbon tetrafluoride mixed gas, or even in the case of a film forming method other than sputtering, the resulting film can be used as a halftone phase shift layer as long as the composition ratio between chromium and fluorine atoms falls within the above-described range. The numbers of carbon and oxygen atoms are only required to be not larger than 250 and not larger than 150, respectively, per 100 chromium atoms.

Although the foregoing description has been made on the assumption that krypton fluoride excimer laser light is used as exposure light, the above-described composition ratios similarly apply in the case of exposure light in other deep-ultraviolet wavelength regions. It is also possible to apply the present invention to exposure carried out at wavelengths in the range of from the ultraviolet region to the visible region, e.g., at the wavelength of the g-line (436 nm) and i-line (365 nm) of a super-high pressure mercury lamp.

In the present invention, the X-ray photoelectron spectroscopy was carried out as follows:

As an X-ray photoelectron spectroscope, ESCALAB210, manufactured by VG SCIENTIFIC, was used. The electron energy analyzer of ESCALAB210 was a 150° concentric hemispherical analyzer, and an X-ray photoelectron spectrum was measured by using a 5-channel thoron detector.

The data processor was DEC Micro PDP11/53, and VGS DATA SYSTEM VGS5250 Version January 1992 was used as software to execute quantitative calculation and other processing.

The analyzer work function of this system was 4.63 eV.

The basic performance of this system was as shown in the table below at 3d5/2 peak of Ag when measurement was carried out at 400 W using MgKα (1253.60 eV) as an exciting line X-ray source:

| Energy resolving power (eV) | 0.82 | 0.86 | 1.00 | 1.50 |
|---|---|---|---|---|
| Sensitivity (kcps/mm$^2$) | 35 | 120 | 330 | 860 |

The measuring conditions were as follows:

As an X-ray source, the exciting line of AlKα rays (1486.60 eV) was used, and measurement was carried out at 300 W.

The angle of incidence of X-rays was about 60° from the normal to the sample. The detector was disposed on the line normal to the sample.

Measurement of the degree of vacuum was carried out by using MILLENIA SERIES IPGCI. The degree of vacuum was in the range of from $5\times10^{-10}$ mbar to $1\times10^{-6}$ mbar. The evacuation system was composed of an ion pump 207-0230 (220 l/s), manufactured by Perkin-Elmer, and DIGITEL500 controller.

As an analysis region, a region of about 1 mm or less in diameter was measured.

The XPS spectrum was measured for each binding energy as follows:

Wide scan: 1,100 eV to 0 eV (B.E.)

Cr 2p: 620 eV to 570 eV (B.E.)

F 1s: 670 eV to 710 eV (B.E.)

O 1s: 560 eV to 520 eV (B.E.)

C 1s: 320 eV to 270 eV (B.E.)

All the measuring operations were carried out in the CAE mode. In the wide scan, the pass energy was 100 eV, with 1 eV step, and the number of times of scanning was 3. In the other cases, the pass energy was 20 eV, with 0.1 eV step, and the number of times of scanning was 3. In all the cases, the channel time was 50 ms.

Although these measuring conditions were adopted in the present invention, it should be noted that these conditions are merely an example, and that in the case of an ordinary system, measurement may be carried out in any practically adequate range in which resolving power and sensitive are not considerably impaired, with the amount of electric charge taken into consideration.

The element composition quantitative calculation procedure was as follows:

The subtraction of the background was made by using the Shirley type in the software. Determination of the background was made by giving careful consideration so that there would be no effect of a satellite of the main peak and that the most natural peak configuration would be obtained. The quantitative calculation was made on the basis of Scofield's relative sensitivity coefficients in the software. That is, the peak area obtained by measurement was divided by the relative sensitivity coefficient, and the composition ratio of each element was calculated from the resulting quotient.

As the composition ratio of each constituent element, the value of the calculated composition ratio that had become approximately constant independently of the etching time was employed.

The Scofield's relative sensitivity coefficients are as follows:

Fluorine: 4.26

Carbon: 1.00

Oxygen: 2.85

Chromium: 7.60

The etching conditions were as follows:

As an ion gun, EX05 differential exhaust type two-stage electrostatic lens-mounted electron bombardment ion gun was used, and as a controller, 400X gun supply unit was used. The magnification of the physical image unit was set at 1.

For measurement of the sample current, 626 sample current meter was used.

Etching was carried out in the vacuum range of from $1\times10^{-7}$ mbar to $1\times10^{6}$ mbar and in the sample current range of about −0.5 μA to −1.5 μA.

The filament current was 2.4 A, the emission current was 5 mA to 10 mA, and the source energy was 3 kV to 5 kV.

As an etching gas, argon gas was used.

The etching time depended on the etch rate of the substrate. Etching and XPS spectral measurement were alternately carried out until the existence ratio of each particular element detected was regarded as being approximately constant.

Charge correction using an electron gun was not carried out.

The above-described measuring conditions and etching conditions in the present invention are merely an example. In general, measurement of equal spectrum quality can be made under other conditions as long as sensitivity and resolving power are not impaired.

Returning to the description of the present invention, in a case where a chromium compound film containing fluorine atoms formed by the method of the present invention is used as a halftone phase shift layer in the form of a single layer, it can be patterned by approximately the same method as that used for the light-blocking film of the conventional photomask because the chromium compound film in the present invention has chromium atoms as the matrix. Even in the case of a multilayer film, if the chromium compound containing fluorine atoms is used in combination with chromium, chromium oxide, chromium nitride, chromium oxide nitride, chromium oxide carbide, chromium oxide carbide nitride, etc., photoengraving can be accomplished in a single patterning process by approximately the same method as in the case of the conventional technique. Accordingly, it is possible to improve the yield and reduce the cost.

As has been described above, the halftone phase shift photomask of the present invention has on a transparent substrate a halftone phase shift layer which includes at least one layer composed mainly of a chromium compound, wherein the chromium compound contains at least fluorine atoms in addition to chromium atoms.

In this case, the chromium compound may contain atoms of at least one element selected from the group consisting of oxygen, carbon, sulfur, nitrogen, and hydrogen, in addition to chromium and fluorine atoms. Further, the layer composed mainly of the chromium compound may contain impurity atoms other than chromium, fluorine, oxygen, carbon, sulfur, nitrogen and hydrogen atoms within the range in which the refractive index for exposure light that is obtained by ellipsometry will not be changed by 0.1 or more. Further, the halftone phase shift layer is preferably formed on the transparent substrate so that the phase difference φ, which is obtained by the following equation, falls within the range of nπ±π/3 radians (n is an odd integer):

$$\phi = \sum_{k=1}^{m-1} x^{k,k+1} + \sum_{k=2}^{m-1} 2\pi(u_k - 1)d_k/\lambda$$

where φ is the phase change of light perpendicularly passing through the photomask having a multilayer (m−2 layers) film formed on the transparent substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and λ is the wavelength of exposure light, and where the layer of k=1 is assumed to be the transparent substrate, and the layer of k=m is assumed to be air.

Further, the transmittance for exposure light of the halftone phase shift layer is preferably in the range of from 1% to 50% when the transmittance at an opening of the halftone phase shift layer for the exposure light is assumed to be 100%. Further, the halftone phase shift layer may include at least a layer of a chromium compound containing fluorine, and a layer of a material selected from the group consisting of chromium, chromium oxide, chromium nitride, chromium oxide nitride, chromium oxide carbide, and chromium oxide carbide nitride.

Further, the above-described chromium compound preferably contains at least 100 fluorine atoms per 100 chromium atoms as analyzed by X-ray photoelectron spectroscopy. It is also preferable for the chromium compound to contain not more than 150 oxygen atoms per 100 chromium atoms and/or not more than 250 carbon atoms per 100 chromium atoms.

The halftone phase shift photomask blank of the present invention has on a transparent substrate a halftone phase shift layer which includes at least one layer composed mainly of a chromium compound, wherein the chromium compound contains at least fluorine atoms in addition to chromium atoms.

In this case, the chromium compound may contain atoms of at least one element selected from the group consisting of oxygen, carbon, sulfur, nitrogen, and hydrogen, in addition to chromium and fluorine atoms. Further, the layer composed mainly of the chromium compound may contain impurity atoms other than chromium, fluorine, oxygen, carbon, sulfur, nitrogen and hydrogen atoms within the range in which the refractive index for exposure light that is obtained by ellipsometry will not be changed by 0.1 or more. Further, the halftone phase shift layer is preferably formed on the transparent substrate sa that the phase difference φ, which is obtained by the following equation, falls within the range of nπ±π/3 radians (n is an odd integer):

$$\phi = \sum_{k=1}^{m-1} x^{k,k+1} + \sum_{k=2}^{m-1} 2\pi(u_k - 1)d_k/\lambda$$

where φ is the phase change of light perpendicularly passing through the photomask blank having a multilayer (m−2 layers) film formed on the transparent substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and λ is the wavelength of exposure light, and where the layer of k=1 is assumed to be the transparent substrate, and the layer of k=m is assumed to be air.

Further, the transmittance for exposure light of the halftone phase shift layer is preferably in the range of from 1% to 50% when the transmittance of the transparent substrate for the exposure light is assumed to be 100%. Further, the halftone phase shift layer may include at least a layer of a chromium compound containing fluorine, and a layer of a material selected from the group consisting of chromium, chromium oxide, chromium nitride, chromium oxide nitride, chromium oxide carbide, and chromium oxide carbide nitride.

Further, the above-described chromium compound preferably contains at least 100 fluorine atoms per 100 chromium atoms as analyzed by X-ray photoelectron spectroscopy. It is also preferable for the chromium compound to contain not more than 150 oxygen atoms per 100 chromium atoms and/or not more than 250 carbon atoms per 100 chromium atoms.

The present invention further provides a method of producing a halftone phase shift photomask blank having on a transparent substrate a halftone phase shift layer which includes at least one layer composed mainly of a chromium compound, wherein chromium is evaporated or sputtered from metal chromium or a chromium compound in a plasma generated from a gas containing fluorine atoms, thereby forming on the transparent substrate a layer composed mainly of a chromium fluoride compound.

In this case, the evaporation of chromium may be effected by bombardment with electrons accelerated by an electron gun, or bombardment with an ionized gas.

The plasma that is produced from a gas containing fluorine atoms may be generated by ionizing a fluorine atom-containing gas while introducing it into the space between the chromium source and the transparent substrate, or introducing a previously ionized, fluorine atom-containing gas into the space between the chromium source and the transparent substrate. The plasma may also be generated by introducing a previously ionized gas into the space between the chromium source and the transparent substrate while introducing a fluorine atom-containing gas into the same space.

It is also possible to direct a previously ionized, fluorine atom-containing gas at the chromium source through the space between the chromium source and the transparent substrate, thereby evaporating chromium and also generating a plasma containing fluorine atoms, and thus forming on the transparent substrate a layer composed mainly of a chromium fluoride compound.

In the halftone phase shift photomask, halftone phase shift photomask blank and halftone phase shift photomask blank producing method of the present invention, the layer composed mainly of a chromium compound, which is used to constitute a halftone phase shift layer, contains at least fluorine atoms in addition to chromium atoms. Therefore, it is possible to obtain a transmittance higher than a predetermined level even in exposure carried out at a relatively short wavelength. Accordingly, the halftone phase shift photomask of the present invention can be used for exposure using deep-ultraviolet radiation, e.g., krypton fluoride excimer laser light. Thus, high-resolution lithography can be realized. In addition, since the photomask can be formed by approximately the same method as in the case of the conventional photomasks, it is possible to improve the yield and reduce the cost.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 16(a) to 16(d) show the principle of halftone phase shift lithography.

FIGS. 17(a) to 17(d) show a conventional lithography method.

DESCRIPTION OF THE PREFERRED EMBODIMENTS

The following is a description of examples of the halftone phase shift photomask, halftone phase shift photomask blank and halftone phase shift photomask blank producing method according to the present invention.

[Example 1]

Figure 1A:
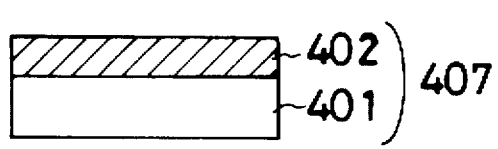
FIGS. 1(a) and 1(b) are sectional views showing the process of obtaining a halftone phase shift photomask blank in Example 1 according to the present invention.

One example of a halftone phase shift photomask blank according to the present invention will be described below with reference to FIGS. 1(a) and 1(b). As shown in FIG. 1(a), on a mirror-polished silicon wafer 401, a chromium compound film 402 was formed to a thickness of about 30 nm by sputtering under the following conditions, thereby obtaining a sample 407 for ellipsometry:

Film forming system: planar DC magnetron sputtering system

Target: metal chromium

Gas and flow rate: argon gas 76 sccm+sulfur hexafluoride gas 24 sccm

Sputter pressure: about 3 mTorr

Sputter current: 6 A

Next, the sample 407 was measured for the refractive index u and extinction coefficient k at the KrF excimer laser wavelength (248 nm) with a commercially available spectroellipsometer (ES-4G, manufactured by Sopra). The results were u=1.996 and k=0.437. With the sample 407 treated as a metal film shown in M. Born, E. Wolf "Principles of Optics", pp. 628–632, mentioned above, a film thickness required for 180° shifting the phase of transmitted light of wavelength 248 nm by the film when formed on a high-purity synthetic quartz substrate used as a photomask substrate was calculated. The required film thickness was determined to be 130 nm.

Figure 1B:
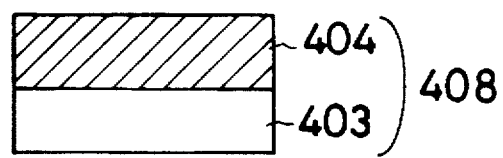
Figure 5:
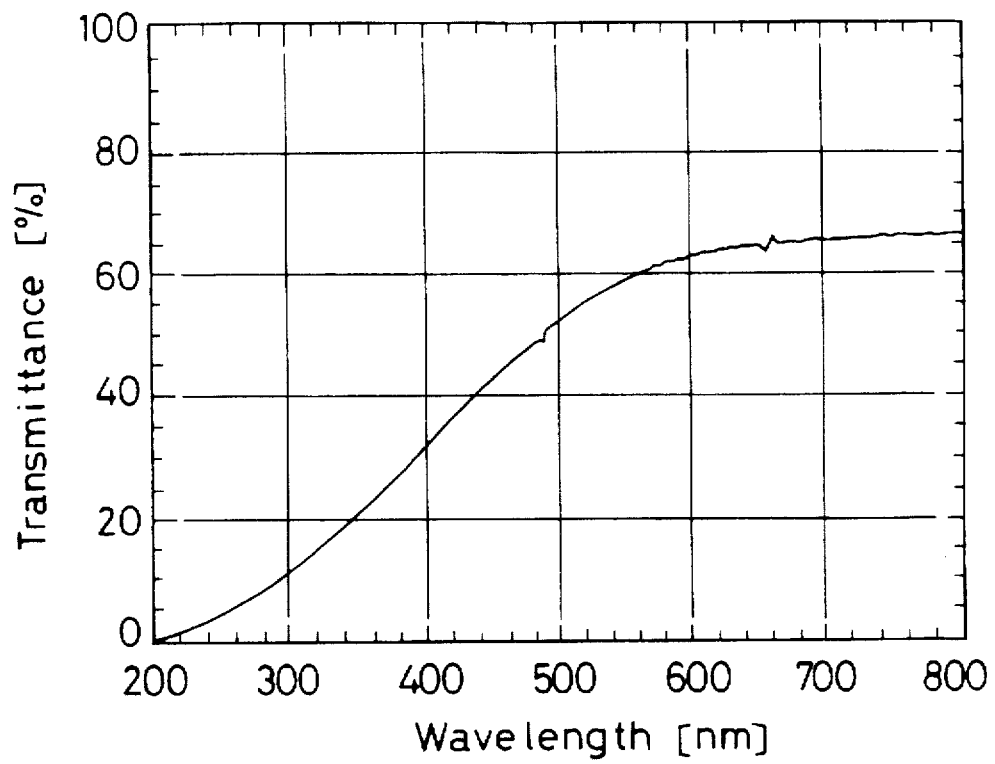
FIG. 5 is a graph showing the spectral transmittance curve of the halftone phase shift photomask blank in Example 1.

Accordingly, as shown in FIG. 1(b), a chromium compound film 404 was formed to a thickness of about 130 nm on an optically polished, satisfactorily cleaned high-purity synthetic quartz substrate 403 under the above-described film forming conditions, thereby obtaining a halftone phase shift photomask blank 408 according to the present invention wherein the transmittance for light of wavelength 248 nm was about 5%. The spectral transmittance curve of this blank is shown in the graph of FIG. 5.

[Example 2]

One example of the halftone phase shift photomask according to the present invention will be explained below with reference to FIGS. 2(a) to 2(c), which show the process sequence for producing it.

Figure 2A:
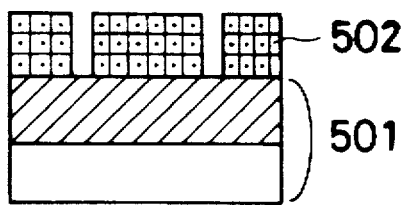
FIGS. 2(a) to 2(c) are sectional views showing the sequence of steps for producing a halftone phase shift photomask in Example 2 according to the present invention.
Figure 2B:
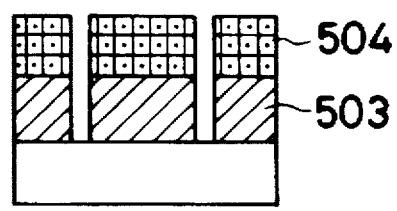
Figure 2C:
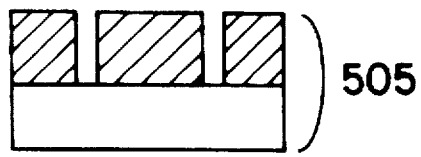

As shown in FIG. 2(a), the surface of the blank 501 obtained in Example 1 was provided with a desired resist pattern 502 of a material containing an organic substance as a principal component by conventional electron beam lithography or photolithography. Next, as shown in FIG. 2(b), the semitransparent film at the openings in the resist pattern was subjected to an RF (radio-frequency) plasma using a mixed gas of $CH_2Cl_2:O_2=1:2.5$ under the pressure of 0.3 Torr to effect selective dry etching, thereby obtaining a desired semitransparent film pattern 503. Finally, the remaining resist 504 was removed by a conventional method, thus obtaining a halftone phase shift photomask 505 of the present invention, as shown in FIG. 2(c), in which the transmittance for light of wavelength 248 nm of the halftone phase shift portion was 5%. It should be noted that the halftone phase shift photomask 505 was practicable in terms of all requirements, i.e., the dimensional accuracy of the etched portions, cross-sectional configuration, film thickness distribution, transmittance distribution, adhesion of the film to the substrate, etc.

[Example 3]

Another example of the halftone phase shift photomask according to the present invention will be explained below.

A halftone phase shift photomask obtained in the same way as in Example 2 was heated for 1 hour at 200° C in a convection oven having an air atmosphere. As a result, the transmittance for light of wavelength 248 nm of the halftone phase shift portion changed from about 5% to about 8%. The halftone phase shift photomask was also practicable in terms of all requirements. i.e., the dimensional accuracy of the etched portions, cross-sectional configuration, film thickness distribution, transmittance distribution, adhesion of the film to the substrate, etc., at any stage of the transmittance changing process.

[Example 4]

Another example of a single-layer halftone phase shift photomask blank according to the present invention will be described below with reference to FIGS. 3(a) to 3(e), which show the process sequence for producing it.

Figure 3A:
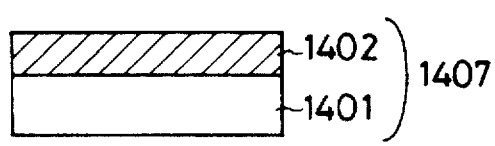
FIGS. 3(a) to 3(e) are sectional views showing the sequence of steps for producing a halftone phase shift photomask in Example 4 according to the present invention.

As shown in FIG. 3(a), on a mirror-polished silicon wafer 1401, a chromium compound film 1402 containing fluorine atoms was formed to a thickness of about 50 nm by sputtering under the following conditions, thereby obtaining a sample 1407 for ellipsometry:

Film forming system: planar DC magnetron sputtering system

Target: metal chromium

Gas and flow rate: argon gas 76 sccm+carbon tetrafluoride gas 24 sccm

Sputter pressure: about 4 mTorr

Sputter current: 6 A

Next, the sample 1407 was measured for the refractive index u and extinction coefficient k at the wavelength 250 nm with a commercially available spectroellipsometer (ES-4G, manufactured by Sopra). The results were u=1.678 and k=0.169. With the sample 1407 treated as a metal film shown in M. Born, E. Wolf "Principles of Optics", pp. 628–632, mentioned above, a film thickness required for 180° shifting the phase of transmitted light of wavelength 250 nm by the film when formed on a high-purity synthetic quartz substrate used as a photomask substrate was calculated. The required film thickness was determined to be 185 nm.

Figure 3B:
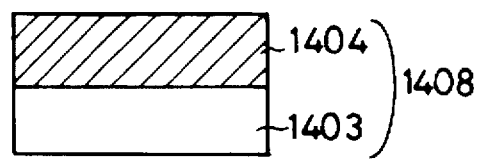
Figure 6:
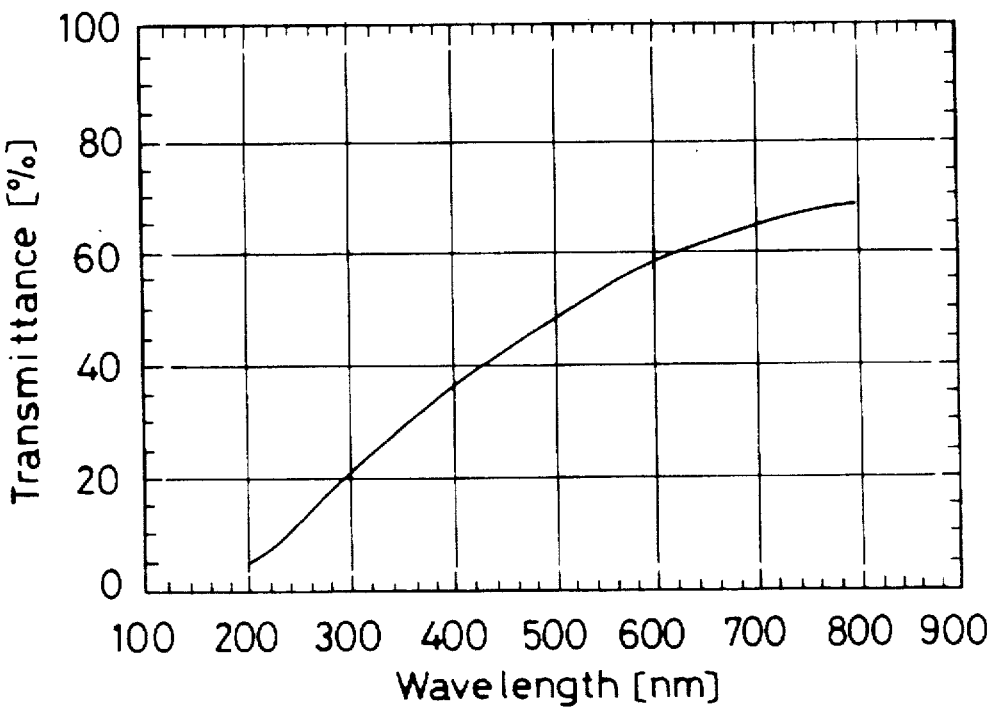
FIG. 6 is a graph showing the spectral transmittance curve of the halftone phase shift photomask blank in Example 4.

Accordingly, as shown in FIG. 3(b), a chromium compound film 1404 was formed to a thickness of about 180 nm on an optically polished, satisfactorily cleaned high-purity synthetic quartz substrate 1403 under the above-described film forming conditions, thereby obtaining a single-layer halftone phase shift photomask blank 1408 according to the present invention wherein the transmittance for light of wavelength 250 nm was about 10.5%. The spectral transmittance curve of this blank is shown in the graph of FIG. 6.

Figure 3C:
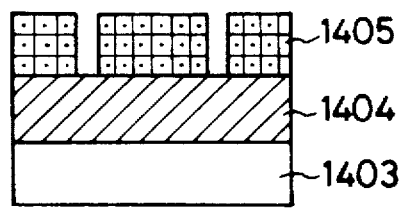
Figure 3D:
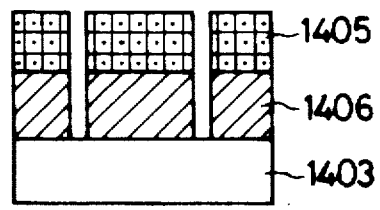
Figure 3E:
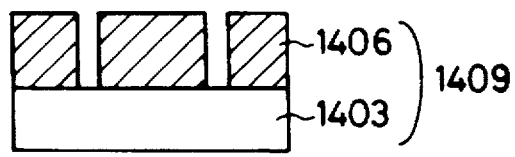

Then, as shown in FIG. 3(c), the surface of the blank obtained as described above was provided with a desired resist pattern 1405 of a material containing an organic substance as a principal component by conventional electron beam lithography or photolithography. Next, as shown in FIG. 3(d), the semitransparent film at the openings in the resist pattern was subjected to an RF plasma using a mixed gas of $CH_2Cl_2:O_2=1:2.5$ under the pressure of 0.3 Torr to effect selective dry etching, thereby obtaining a desired semitransparent film pattern 1406. At this time, the etch rate of the chromium compound film was about 0.6 nm/sec. Finally, the remaining resist was removed by a conventional method, thus obtaining a single-layer halftone phase shift photomask 1409 of the present invention, as shown in FIG. 3(e).

The single-layer halftone phase shift photomask was also practicable in terms of all requirements, i.e., the dimensional accuracy of the etched portions, cross-sectional configuration, film thickness distribution, transmittance distribution, adhesion of the film to the substrate, etc.

[Example 5]

One example of a multilayer halftone phase shift photomask according to the present invention will be described below with reference to FIGS. 4(a) to 4(d), which show the process sequence for producing it.

Figure 4A:
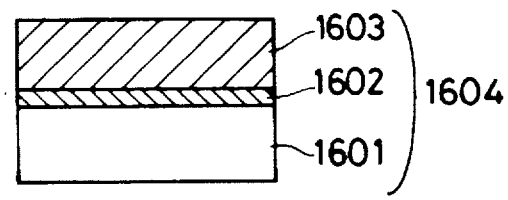
FIGS. 4(a) to 4(d) are sectional views showing the sequence of steps for producing a halftone phase shift photomask in Example 5 according to the present invention.

As shown in FIG. 4(a), on a synthetic quartz substrate 1601 for a photomask, a metal chromium film 1602 was formed to a thickness of about 40 nm by sputtering under the following conditions.

Film forming system: planar DC magnetron sputtering system

Target: metal chromium

Gas and flow rate: argon gas 100 sccm

Sputter pressure: about 3 mTorr

Sputter current: 6 A

Figure 7:
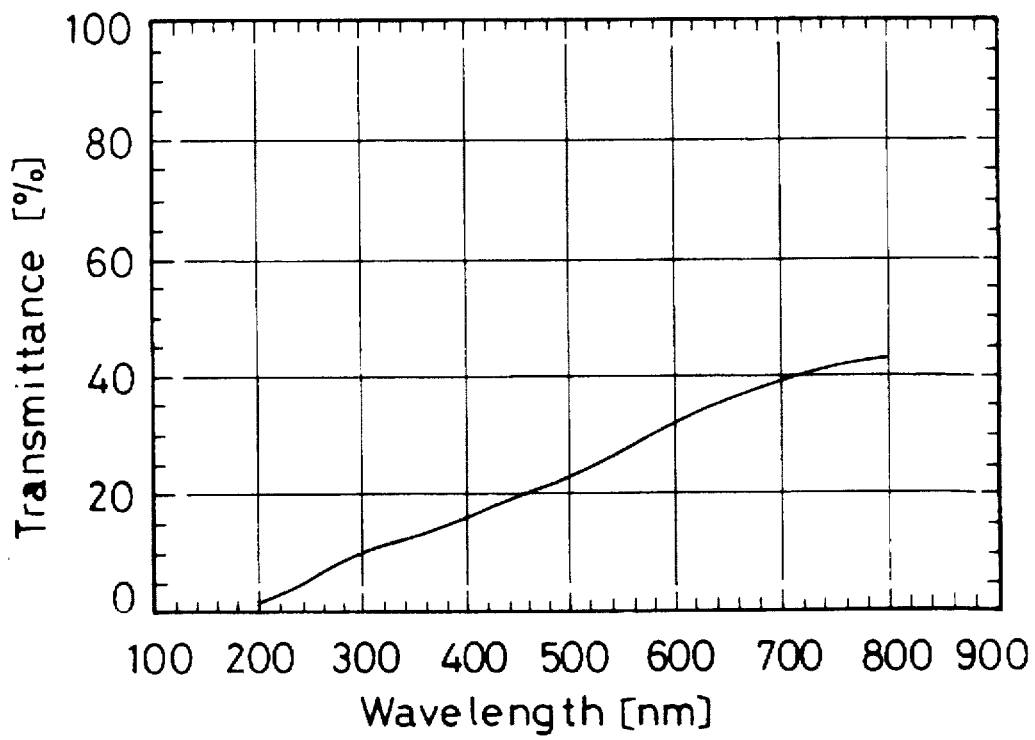
FIG. 7 is a graph showing the spectral transmittance curve of the halftone phase shift photomask blank in Example 5.
Figure 8:
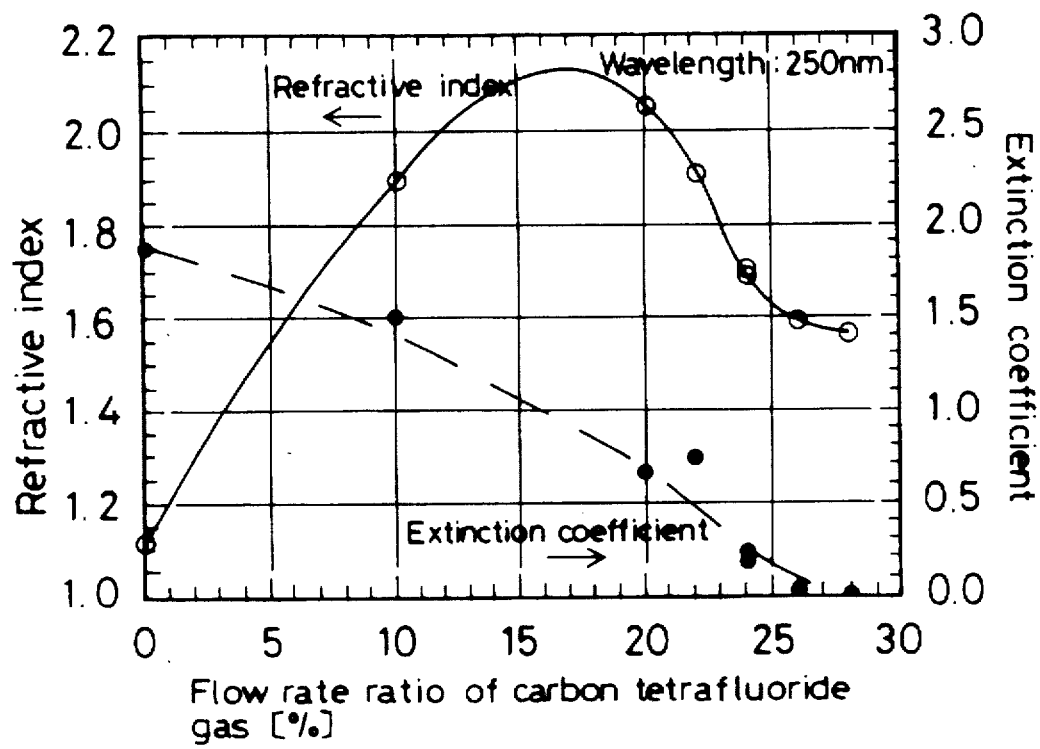
FIG. 8 is a graph showing the values of refractive index and extinction coefficient measured with the sputtering gas flow rate ratio varied.
Figure 9:
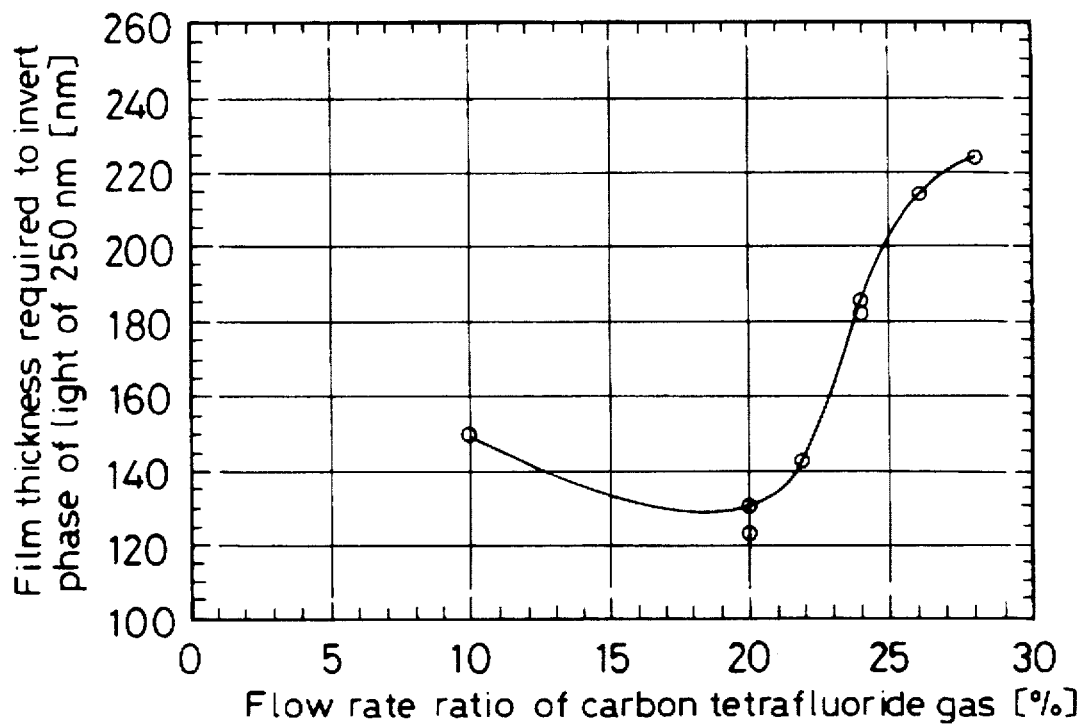
FIG. 9 is a graph showing the relationship between the film thickness required to effect phase inversion and the sputtering gas flow rate ratio.
Figure 10:
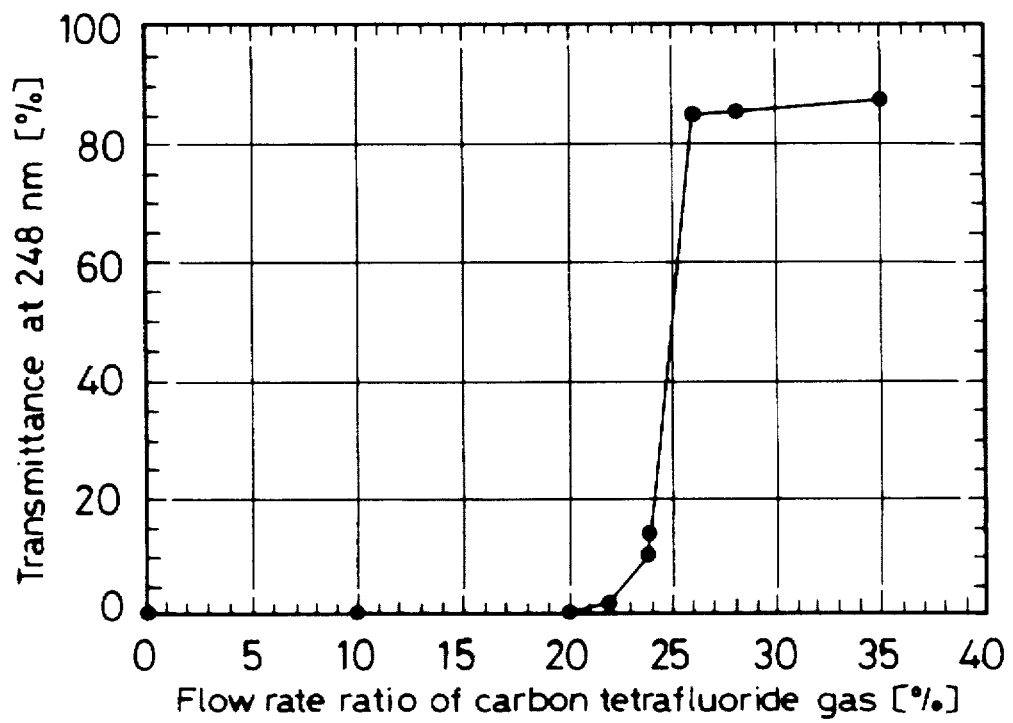
FIG. 10 is a graph showing the relationship between the transmittance and the sputtering gas flow rate ratio.
Figure 11:
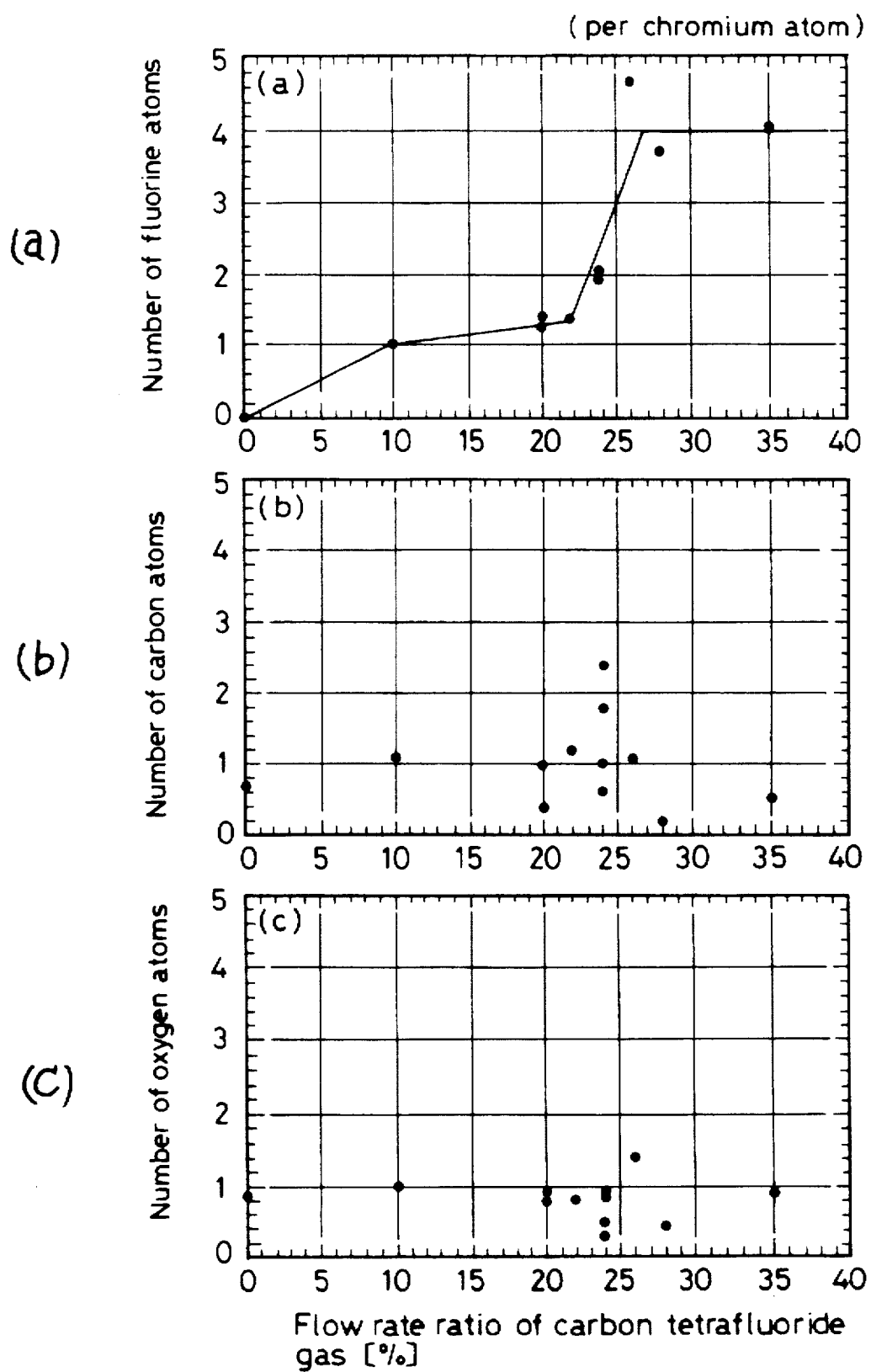
FIGS. 11(a), (b) and (c) are graphs respectively showing the relationships between the numbers of fluorine, carbon and oxygen atoms existing relative to the number of chromium atoms on the one hand and the sputtering gas flow rate ratio on the other.

Next, a chromium compound film 1603 containing fluorine atoms was formed on the metal chromium film 1602 to the same thickness under the same conditions as in Example 4, thereby obtaining a multilayer halftone phase shift photomask blank 1604 of the present invention. The spectral transmittance curve of the blank 1604 is shown in FIG. 7. The transmittance at the wavelength 248 nm of the blank 1604 was 5.5%.

Figure 4B:
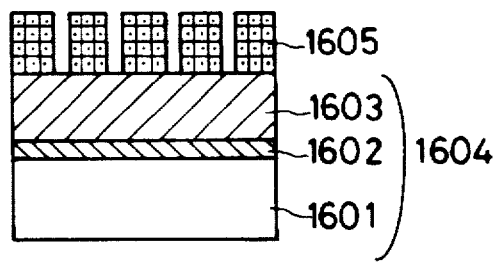
Figure 4C:
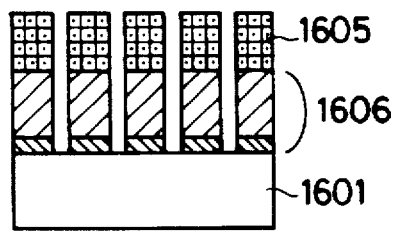
Figure 4D:
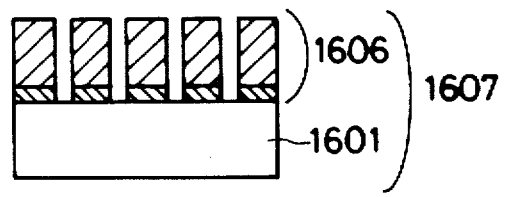

As shown in FIG. 4(b), the surface of the blank 1604 was provided with a desired resist pattern 1605 of a material containing an organic substance as a principal component by conventional electron beam lithography or photolithography- Next, as shown in FIG. 4(c), the multilayer halftone phase shift film at the openings in the resist pattern was subjected to an RF plasma using a mixed gas of $CH_2Cl_2:O_2=1:2.5$ under the pressure of 0.3 Torr to effect selective dry etching at one process, thereby obtaining a desired semitransparent film pattern 1606. Finally, the remaining resist was removed by a conventional method, thus obtaining a multilayer halftone phase shift photomask 1607 of the present invention, as shown in FIG. 4(d).

Since the chromium compound layer 1603 containing fluorine atoms has chromium atoms as the matrix in the same way as the metal chromium film 1602, the etching characteristics of the chromium compound layer 1603 and the metal film 1602 are substantially the same. Accordingly, the pattern processing characteristics of the multilayer halftone phase shift photomask are approximately the same as those of the single-layer halftone phase shift photomask as shown in Example 4.

The multilayer halftone phase shift photomask was also practicable in terms of all requirements, i.e., the dimensional accuracy, cross-sectional configuration, film thickness distribution, transmittance distribution, adhesion of the film to the substrate, etc.

Next, the halftone phase shift photomask blank producing method of the present invention will be described as being Examples 6 and 7. Prior to the description of the examples, some examples of a system used to carry out the production method of the present invention will be explained.

Figure 12:
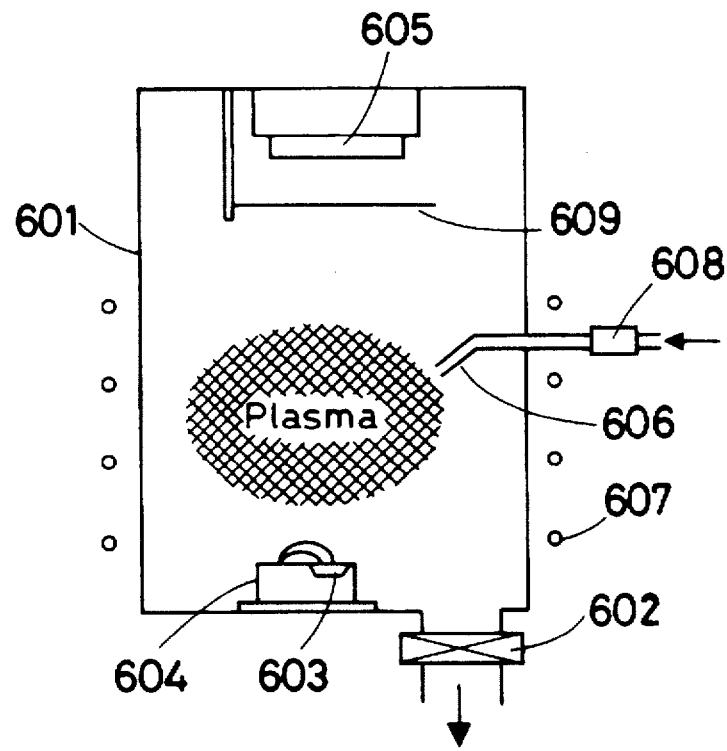
FIG. 12 illustrates one example of a system used to carry out the method of producing a halftone phase shift photomask blank according to the present invention.

FIG. 12 illustrates one example of a system used to produce the halftone phase shift photomask blank of the present invention. Referring to FIG. 12, a vacuum tank 601 is connected to an evacuation system through a butterfly valve 602. A chromium evaporation source 603, an electron gun 604, and a photomask substrate 605 are disposed in the vacuum chamber 601. Reference numeral 606 denotes a reaction gas supply port, and 607 an RF current supply coil.

With the butterfly valve 602 opened, the inside of the vacuum chamber 601 is evacuated to a predetermined degree of vacuum. Thereafter, carbon tetrafluoride gas is introduced into the vacuum chamber 601 through the supply port 606 with the flow rate controlled by a mass flow controller 608. Next, the pressure in the vacuum chamber 601 is controlled to a degree of vacuum suitable for generating a plasma by controlling the butterfly valve 602, and an RF current is supplied to the coil 607, thereby generating a plasma in the space between the substrate 605 and the evaporation source 603. Subsequently, accelerated electrons from the electron gun 604 are directed at the evaporation source 603 of pure-metal chromium to initiate evaporation of chromium. After the electron emission condition and the plasma discharge condition have become stabilized, a shutter 609 covering the substrate 605 is opened to initiate film formation, thereby forming a film to a predetermined thickness.

Figure 13:
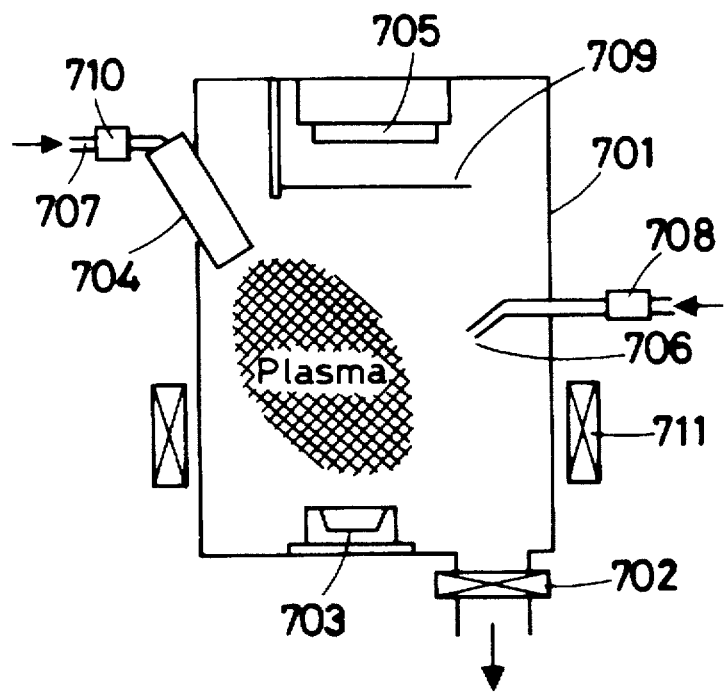
FIG. 13 illustrates another system usable for the halftone phase shift photomask blank producing method of the present invention.

FIG. 13 illustrates another example of a system used to carry out the halftone phase shift photomask blank producing method of the present invention. A vacuum chamber 701 has the same arrangement as that of the vacuum chamber 601 shown in FIG. 12 except that it is equipped with an ion gun 704. The ion gun 704 ionizes a gas supplied into the chamber 701 from a carrier gas inlet port 707, thereby generating a carrier gas plasma in the space between the chromium evaporation source 703 and the photomask substrate 705. The ion gun 704 further directs the ionized gas at the chromium evaporation source 703 to evaporate chromium.

In the production of a halftone phase shift photomask blank by this system, the butterfly valve 702 is opened, and the inside of the vacuum chamber 701 is evacuated to a predetermined degree of vacuum. Thereafter, argon is supplied into the vacuum chamber 701 with the flow rate controlled by the mass flow controller 710. In addition, the pressure is controlled to a level suitable for generating a plasma by controlling the butterfly valve 702. Then, an electric current is supplied to the filament in the ion gun 704, and a voltage is applied to the ion beam drawing electrode, thereby ionizing argon passing through the ion gun 704, and thus generating an argon plasma in the vacuum chamber 701. A convergence coil 711 controls the spread of the plasma. Next, carbon tetrafluoride is supplied into the vacuum chamber 701 from the gas supply port 706 with the flow rate controlled by the mass flow controller 708. After the plasma has become stabilized, the shutter 709 is opened to initiate film formation on the substrate 705.

Figure 14:
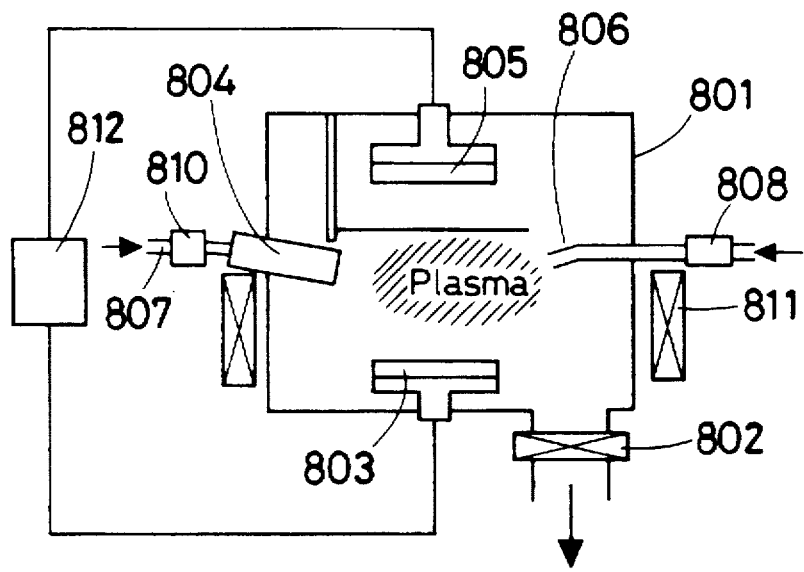
FIG. 14 illustrates still another system usable for the halftone phase shift photomask blank producing method of the present invention.

FIG. 14 illustrates still another example of a system used to carry out the halftone phase shift photomask blank producing method of the present invention. A vacuum chamber 801 has the same arrangement as that of the vacuum chamber 601 shown in FIG. 12 except that it is equipped with an ion gun 804. The ion gun 804 ionizes a gas supplied into the vacuum chamber 801 from a carrier gas inlet port 807, thereby generating a carrier gas plasma in the space between the chromium target 803 and the photomask substrate 805. The mass flow controller 808 supplies a fluorine atom-containing gas into the vacuum chamber 801 from the gas supply port 806 while controlling the flow rate in the same way as in the system shown in FIG. 13. An RF or DC voltage is applied between the chromium target 803 and the photomask substrate 805 from a power supply 812 to generate chromium particles by sputtering. The chromium particles are allowed to react with the fluorine atom-containing gas plasma, thereby forming a fluorine atom-containing chromium compound film on the photomask substrate 805.

[Example 6]

A halftone phase shift photomask blank was produced by using the system shown in FIG. 12. With the butterfly valve 602 opened, the inside of the vacuum chamber 601 was evacuated to $1 \times 10^{-5}$ Torr. Thereafter, carbon tetrafluoride gas was introduced into the vacuum chamber 601 through the supply port 606 with the flow rate controlled to 100 sccm by the mass flow controller 608. Next, the pressure in the vacuum chamber 601 was controlled to $5 \times 10^{-3}$ Torr by controlling the butterfly valve 602, and an RF current (13.56 MHz) of 150 W was supplied to the coil 607, thereby generating a plasma in the space between the substrate 605 and the evaporation source 603. Subsequently, accelerated electrons from the electron gun 604 were directed at the evaporation source 603 of pure metal chromium to initiate evaporation of chromium. After the electron emission condition and the plasma discharge condition had become stabilized, the shutter 609 covering the substrate 605 was opened to initiate film formation. At this time, the rate of film formation was monitored by using a quartz film thickness monitor. The film formation rate was 0.5 nm per second.

A film was deposited to about 50 nm on a silicon wafer under the above-described conditions, and the optical constant of the film at the KrF excimer laser wavelength (248 nm) was obtained by ellipsometry. The results were u=1.723 and k=0.2255. With the film treated as a metal film shown in M. Born, E. Wolf "Principles of Optics", pp. 628–632, a film thickness required for 180° shifting the phase of transmitted light of wavelength 248 nm by the film when formed on a photomask substrate was calculated. The required film thickness was determined to be 170 nm.

When the fluorine atom-containing chromium compound film obtained was measured by X-ray electron spectroscopy (ESCALAB210, manufactured by VG SCIENTIFIC), the ratio of the number of chromium atoms to the number of fluorine atoms was 1:2.

Figure 15:
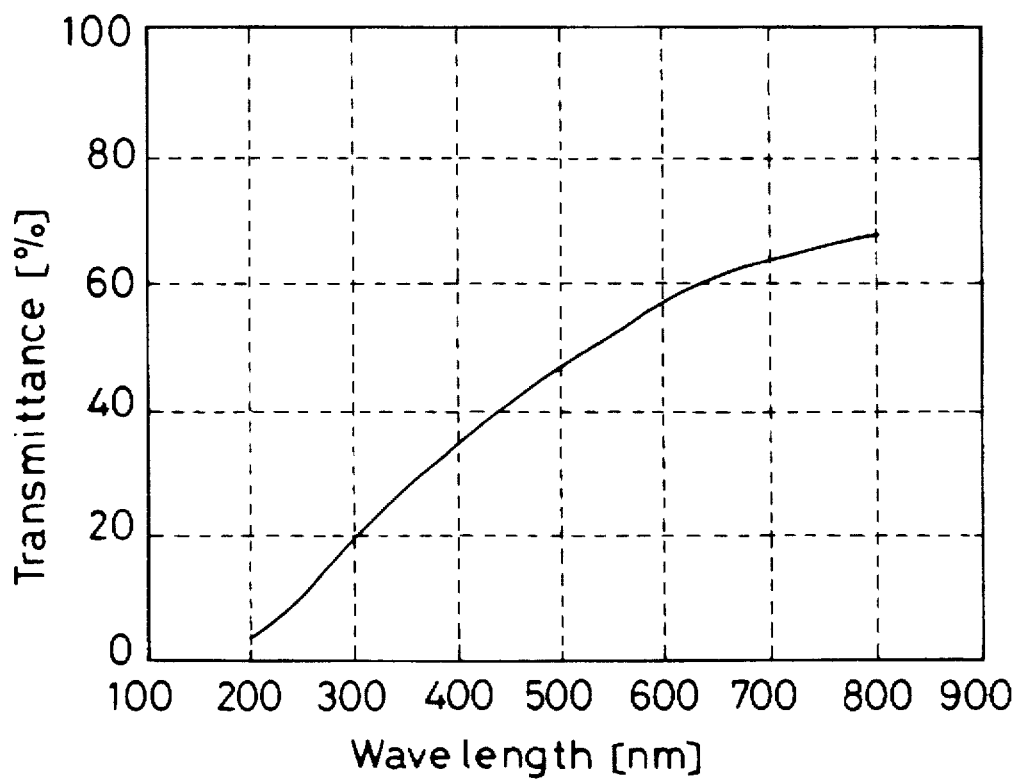
FIG. 15 is a graph showing the transmittance of a fluorine atom-containing chromium compound film obtained in Example 6 of the present invention.
Figure 18:
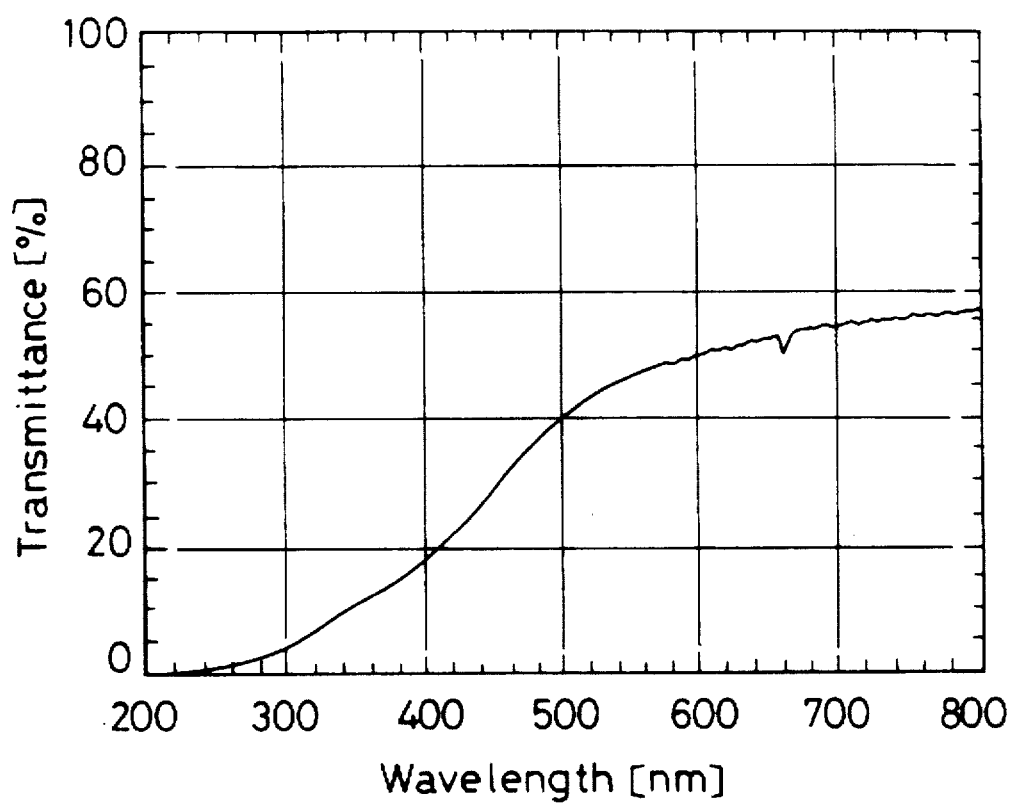
FIG. 18 is a graph showing the spectral transmittance curve of a chromium oxide film.

A fluorine atom-containing chromium compound film was formed to about 170 nm on an optically polished, satisfactorily cleaned high-purity synthetic quartz substrate under the same conditions as the above. The transmittance of this film is shown in the graph of FIG. 15. It should be noted that the transmittance for light of wavelength 248 nm was about 10.5%. The halftone phase shift photomask blank can be formed into a mask by approximately the same method as in the case of the conventional photomasks. Thus, the blank can be processed into an excellent halftone phase shift photomask for KrF excimer laser exposure.

[Example 7]

A halftone phase shift photomask blank of the present invention was produced by using the system shown in FIG. 13.

With the butterfly valve 702 opened, the inside of the vacuum chamber 701 was evacuated to $1 \times 10^{-5}$ Torr. Thereafter, argon was supplied into the vacuum chamber 701 with the flow rate controlled to 50 sccm by the mass flow controller 710. At this time, the pressure was controlled to $5 \times 10^{-3}$ Torr by controlling the butterfly valve 702. Thereafter, an electric current was supplied to the filament in the ion gun 704, and a voltage was applied to the ion beam drawing electrode, thereby ionizing argon passing through the ion gun 704, and thus generating an argon plasma in the vacuum chamber 701. The spread of the plasma was controlled by the convergence coil 711. Next, carbon tetrafluoride was supplied into the vacuum chamber 701 from the gas supply port 706 with the flow rate controlled to 50 sccm by the mass flow controller 708. After the plasma had become stabilized, the shutter 709 was opened to initiate film formation on the substrate 705.

The fluorine atom-containing chromium compound film formed by this method exhibited approximately the same characteristics as those of the film formed in Example 6. Thus, the film served as an excellent shifter for a halftone phase shift photomask.

As will be clear from the foregoing description, in the halftone phase shift photomask, halftone phase shift photomask blank and halftone phase shift photomask blank producing method of the present invention, the layer composed mainly of a chromium compound, which is used to constitute a halftone phase shift layer, contains at least fluorine atoms in addition to chromium atoms. Therefore, it is possible to obtain a transmittance higher than a predetermined level even in exposure carried out at a relatively short wavelength. Accordingly, the halftone phase shift photomask of the present invention can be used for exposure using deep-ultraviolet radiation, e.g., krypton fluoride excimer laser light. Thus, high-resolution lithography can be realized. In addition, since the photomask can be formed by approximately the same method as in the case of the conventional photomasks, it is possible to improve the yield and reduce the cost.

What we claim is:

1. A halftone phase shift photomask having on a transparent substrate a halftone phase shift layer which includes at least one layer composed mainly of a chromium compound, wherein said chromium compound contains at least fluorine atoms in addition to chromium atoms.

2. A halftone phase shift photomask according to claim 1, wherein said chromium compound contains atoms of at least one element selected from the group consisting of oxygen, carbon, sulfur, nitrogen, and hydrogen, in addition to chromium and fluorine atoms.

3. A halftone phase shift photomask according to claim 1 or 2, wherein said at least one layer composed mainly of said chromium compound contains impurity atoms other than chromium, fluorine, oxygen, carbon, sulfur, nitrogen and hydrogen atoms within the range in which the refractive index for exposure light that is obtained by ellipsometry will not be changed by 0.1 or more.

4. A halftone phase shift photomask according to any of claims 1 to 2, wherein said halftone phase shift layer is formed on said transparent substrate so that the phase difference $\phi$, which is obtained by the following equation, falls within the range of $n\pi \pm \pi/3$ radians (n is an odd integer):

$$\phi = \sum_{k=1}^{m-1} x^{k,k+1} + \sum_{k=2}^{m-1} 2\pi(u_k - 1)d_k/\lambda$$

where $\phi$ is the phase change of light perpendicularly passing through the photomask having a multilayer (m−2 layers) film formed on said transparent substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and $\lambda$ is the wavelength of exposure light, and where the layer of k=1 is assumed to be said transparent substrate, and the layer of k=m is assumed to be air.

5. A halftone phase shift photomask according to any of claims 1 to 2, wherein the transmittance for exposure light of said halftone phase shift layer is in the range of from 1% to 50% when the transmittance at an opening of said halftone phase shift layer for the exposure light is assumed to be 100%.

6. A halftone phase shift photomask according to any of claims 1 to 2, wherein said halftone phase shift layer includes at least a layer of a chromium compound containing fluorine, and a layer of a material selected from the group consisting of chromium, chromium oxide, chromium nitride, chromium oxide nitride, chromium oxide carbide, and chromium oxide carbide nitride.

7. A halftone phase shift photomask according to any of claims 1 to 2, wherein said chromium compound contains at least 100 fluorine atoms per 100 chromium atoms as analyzed by X-ray photoelectron spectroscopy.

8. A halftone phase shift photomask according to any of claims 1 to 2, wherein said chromium compound contains not more than 150 oxygen atoms per 100 chromium atoms as analyzed by X-ray photoelectron spectroscopy.

9. A halftone phase shift photomask according to any of claims 1 to 2, wherein said chromium compound contains not more than 250 carbon atoms per 100 chromium atoms as analyzed by X-ray photoelectron spectroscopy.

10. A halftone phase shift photomask blank having on a transparent substrate a halftone phase shift layer which includes at least one layer composed mainly of a chromium compound, wherein said chromium compound contains at least fluorine atoms in addition to chromium atoms.

11. A halftone phase shift photomask blank according to claim 10, wherein said chromium compound contains atoms of at least one element selected from the group consisting of oxygen, carbon, sulfur, nitrogen, and hydrogen, in addition to chromium and fluorine atoms.

12. A halftone phase shift photomask blank according to claim 10 or 11, wherein said at least one layer composed mainly of said chromium compound contains impurity atoms other than chromium, fluorine, oxygen, carbon, sulfur, nitrogen and hydrogen atoms within the range in which the refractive index for exposure light that is obtained by ellipsometry will not be changed by 0.1 or more.

13. A halftone phase shift photomask blank according to any of claims 10 to 11, wherein said halftone phase shift layer is formed on said transparent substrate so that the phase difference $\phi$, which is obtained by the following equation, falls within the range of $n\pi \pm \pi/3$ radians (n is an odd integer):

$$\phi = \sum_{k=1}^{m-1} x^{k,k+1} + \sum_{k=2}^{m-1} 2\pi(u_k - 1)d_k/\lambda$$

where $\phi$ is the phase change of light perpendicularly passing through the photomask blank having a multilayer (m−2 layers) film formed on said transparent substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and $\lambda$ is the wavelength of exposure light, and where the layer of k=1 is assumed to be said transparent substrate, and the layer of k=m is assumed to be air.

14. A halftone phase shift photomask blank according to any of claims 10 to 11, wherein the transmittance for exposure light of said halftone phase shift layer is in the range of from 1% to 50% when the transmittance of said transparent substrate for the exposure light is assumed to be 100%.

15. A halftone phase shift photomask blank according to any of claims 10 to 11, wherein said halftone phase shift layer includes at least a layer of a chromium compound containing fluorine, and a layer of a material selected from the group consisting of chromium, chromium oxide, chromium nitride, chromium oxide nitride, chromium oxide carbide, and chromium oxide carbide nitride.

16. A halftone phase shift photomask blank according to any of claims 10 to 11, wherein said chromium compound contains at least 100 fluorine atoms per 100 chromium atoms as analyzed by X-ray photoelectron spectroscopy.

17. A halftone phase shift photomask blank according to any of claims 10 to 11, wherein said chromium compound contains not more than 150 oxygen atoms per 100 chromium as analyzed by X-ray photoelectron spectroscopy.

18. A halftone phase shift photomask blank according to any of claims 10 to 11, wherein said chromium compound contains not more than 250 carbon atoms per 100 chromium atoms as analyzed by X-ray photoelectron spectroscopy.

19. A photomask consisting of a transparent substrate having thereon a halftone phase shift layer, wherein the halftone phase shift layer includes at least one layer composed mainly of a chromium compound containing at least fluorine atoms in addition to chromium atoms.

* * * * *